United States Patent
Bruland

(10) Patent No.: US 9,991,090 B2
(45) Date of Patent: Jun. 5, 2018

(54) DUAL LASER BEAM SYSTEM USED WITH AN ELECTRON MICROSCOPE AND FIB

(71) Applicant: FEI Company, Hillsboro, OR (US)

(72) Inventor: Kelly Bruland, Portland, OR (US)

(73) Assignee: FEI Company, Hillsboro, OR (US)

( * ) Notice: Subject to any disclaimer, the term of this patent is extended or adjusted under 35 U.S.C. 154(b) by 1218 days.

(21) Appl. No.: 13/677,854

(22) Filed: Nov. 15, 2012

(65) Prior Publication Data

US 2014/0131195 A1    May 15, 2014

(51) Int. Cl.
*H01J 37/22* (2006.01)
*H01J 37/305* (2006.01)

(52) U.S. Cl.
CPC .......... *H01J 37/226* (2013.01); *H01J 37/228* (2013.01); *H01J 37/3056* (2013.01); *H01J 2237/31749* (2013.01)

(58) Field of Classification Search
CPC .... H01J 37/228; H01J 37/226; H01J 37/3056; H01J 2237/31749
See application file for complete search history.

(56) References Cited

U.S. PATENT DOCUMENTS

| | | | |
|---|---|---|---|
| 3,866,398 A * | 2/1975 | Vernon, Jr. | B08B 15/007 134/1.3 |
| 5,656,186 A | 8/1997 | Mourou et al. | |
| 6,900,447 B2 | 5/2005 | Gerlach et al. | |
| 7,161,159 B2 | 1/2007 | Hill et al. | |
| 7,288,466 B2 | 10/2007 | Takeishi et al. | |
| 7,357,486 B2 * | 4/2008 | Cahill et al. | 347/54 |
| 7,601,976 B2 | 10/2009 | Hill et al. | |
| 7,628,865 B2 | 12/2009 | Singh | |
| 7,923,306 B2 | 4/2011 | Bruland et al. | |
| 8,013,311 B2 | 9/2011 | Hill et al. | |
| 8,076,650 B2 | 12/2011 | Smith et al. | |
| 8,097,829 B2 * | 1/2012 | Fukuda et al. | 219/121.76 |
| 8,168,961 B2 * | 5/2012 | Straw et al. | 250/492.3 |
| 8,183,547 B2 | 5/2012 | Miller | |

(Continued)

FOREIGN PATENT DOCUMENTS

| | | | |
|---|---|---|---|
| JP | 2002096187 A | 4/2002 |
| JP | 2003066375 A | 3/2003 |

(Continued)

*Primary Examiner* — John Brayton
(74) *Attorney, Agent, or Firm* — Michael O. Scheinberg; John B. Kelly; John E. Hillert

(57) ABSTRACT

The present invention discloses an electron microscope and FIB system for processing and imaging of a variety of materials using two separate laser beams of different characteristics. The first laser beam is used for large bulk material removal and deep trench etching of a workpiece. The second laser beam is used for finer precision work, such as micromachining of the workpiece, small spot processing, or the production of small heat affected zones. The first laser beam and the second laser beam can come from the same laser source or come from separate laser sources. Having one laser source has the additional benefits of making the system cheaper and being able to create separate external and internal station such that the debris generated from bulk material removal from the first laser beam will not interfere with vacuum or components inside the particle beam chamber.

26 Claims, 8 Drawing Sheets

(56) References Cited

U.S. PATENT DOCUMENTS

| | | | |
|---|---|---|---|
| 8,314,410 | B2 | 11/2012 | Straw et al. |
| 8,399,864 | B2 | 3/2013 | Hill et al. |
| 8,405,054 | B2 | 3/2013 | Smith et al. |
| 8,524,139 | B2* | 9/2013 | Toth ................. B23K 26/12 219/121.6 |
| 8,766,213 | B2 | 7/2014 | Straw et al. |
| 2005/0018738 | A1* | 1/2005 | Duan ................. B41J 3/4071 372/55 |
| 2006/0157457 | A1 | 7/2006 | Sakurai et al. |
| 2009/0218488 | A1* | 9/2009 | Wells ........................ 250/307 |
| 2011/0031655 | A1 | 2/2011 | Toth et al. |
| 2011/0115129 | A1 | 5/2011 | Straw et al. |
| 2011/0135840 | A1 | 6/2011 | Doye et al. |
| 2011/0163068 | A1 | 7/2011 | Utlaut et al. |
| 2011/0198326 | A1* | 8/2011 | Doemer ................. 219/121.72 |
| 2011/0309553 | A1 | 12/2011 | Huff |
| 2012/0103945 | A1 | 5/2012 | Straw et al. |
| 2012/0200007 | A1 | 8/2012 | Straw et al. |

FOREIGN PATENT DOCUMENTS

| | | | |
|---|---|---|---|
| JP | 2004106048 | A | 4/2004 |
| JP | 2007296533 | A | 11/2007 |
| JP | 2008068275 | A | 3/2008 |
| JP | 2011167763 | A | 9/2011 |
| WO | 2011127327 | A2 | 10/2011 |

\* cited by examiner

DUAL LASER BEAM SYSTEM USED WITH AN ELECTRON MICROSCOPE AND FIB

TECHNICAL FIELD OF THE INVENTION

The present invention relates to a configuration of laser processing tools wherein separate laser processing spots are used with a charged particle beam instrument and/or electron microscope.

BACKGROUND OF THE INVENTION

The use of a laser with electron microscopes and focused ion beam (FIB) systems provides a variety of applications in the field of manufacturing, repair, and inspection of miniature devices, such as integrated circuits, magnetic recording heads, and photolithography masks. The applications can also be used in the fields of energy exploration, material sciences, and biology. The electron microscope, typically a scanning electron microscope (SEM), provides high-resolution image with minimal damage to the target, or workpiece, and the FIB is used to alter the workpiece and to form images. Other types of electron microscopes, such as transmission electron microscopes (TEM) and scanning transmission electron microscopes (STEM) can also be used.

The usage of both a FIB with a SEM/STEM/TEM can provide the ability to image inside of a specimen. FIB systems operate in a similar fashion to a scanning electron microscope except, rather than a beam of electrons and as the name implies, FIB systems use a finely focused beam of ions (usually gallium) that can be operated at low beam currents for imaging or high beam currents for site specific imaging, deposition, or milling. One common usage of FIB tools is to machine surfaces. An ideal FIB machine might be able to machine tens or hundreds of microns into a sample with high beam currents and acceleration potentials. With low beam currents and acceleration potentials, it may be able to machine away layers approaching atomic thicknesses without damaging layers that are nanometer scale or even less. Such micro- and nano-machining capability of the FIB is often very effective when used with the SEM/STEM/TEM for high resolution imaging. In other processes, a FIB could be used to cut unwanted electrical connections, and/or to deposit conductive material in order to make a connection in a semiconductor. FIBs are also used for maskless implantation. In these FIB and/or SEM processes, it is often needed to create an environment that is relatively free from obstructions. Unfortunately, a number of different processes, including the bulk material removal processes, will create large amounts of debris that can potentially interfere with the SEM/STEM/TEM and FIB.

A use of a laser has recently been introduced in this field for rapid processing of the workpiece. For example, U.S. Pat. Pub. 2011/0163068, by Utlaut et al., for "Multibeam System" filed Jan. 9, 2009, is directed to a FIB system that uses an additional laser beam for rapid processing. When used together with a SEM/STEM/TEM and FIB system, the process of laser ablation can remove materials from surfaces by irradiating it. Very fast picosecond lasers perform an athermal ablation process while slower nanosecond and continuous wave lasers ("CW lasers") provide thermal ablation processes.

Usually, laser ablation is performed using a pulsed laser. As compared to charged particle beam processing, laser ablation is capable of removing a relatively massive amount of material very quickly. The wavelength of lasers, however, is much larger than the wavelength of the charged particles in the charged particle beams. Because the size to which a beam can be focused is, in part, limited by the beam wavelength, the minimum spot size of a laser beam is typically larger than the minimum spot size of a charged particle beam. Thus, while a charged particle beam typically has finer resolution than a laser beam and can micromachine an extremely small structure, the beam current is limited and the micromachining operation can be unacceptably slow. Laser micromachining, on the other hand, is generally much faster, but the resolution is inherently limited by the longer beam wavelength. Other uses of laser machining are described, for example, in U.S. Pat. No. 8,168,961, by Straw et al., for "Charged Particle Beam Masking for Laser Ablation Micromachining," which is assigned to the assignee of the present invention and is hereby incorporated by reference. U.S. Pat. No. 8,168,961, is not admitted to be prior art by its inclusion in this Background section.

Recent advancements allow the use of lasers for careful preparation of workpieces so that they can be used for a SEM/STEM/TEM and FIB system. SEM/STEM/TEM and FIB tools require prepared samples with thin heat affected zone ("HAZ") areas, and the system may target one extremely precise location within a large sample, such as a submicron scale defect. It is generally not known how to use laser techniques to cut bulk samples while at the same time being able to produce thin HAZ and/or micron scale end pointing that is suitable for SEM/STEM/TEM and FIB processing.

There are some instances when different types of lasers are preferred. Some lasers are best for large bulk material removal from workpieces. For example, these lasers can cut packaging materials or cut out large unnecessary materials from the workpiece so that the workpiece is of appropriate size for analysis. They can also be used for cutting deep trenches in a workpiece, so that an area for study can be exposed. Lasers employed for cutting typically range in power from watts to hundreds of watts. Pulse widths ranging from a nanosecond up to continuous wave are common. Longer wavelengths (e.g., common visible and near IR wavelengths), such as 532 nm, 1064 nm, and up to 10.6 microns (e.g. $CO_2$ lasers) are often used. These lasers provide high laser fluence (pulse energy divided by irradiated area) to a workpiece, exceeding the ablation threshold to produce a range of features including holes and trenches. The high powers used in these rapid cutting processes tend to cause a heat affected zone that must be removed prior to performing fine SEM/STEM/TEM and FIB processes such as imaging or circuit editing. Debris incompatible with the vacuum environment of the FIB and SEM/STEM/TEM may also be produced by the high material removal rates.

Different types of lasers are better suited for precision work such as micro-machining, drilling, routing, trenching, etching, and heat affected zone removal processes. Common lasers for this type of work employ shorter wavelengths, shorter pulse widths, and more tightly focused spots than lasers used for bulk material removal. While lasers up to micron-scale wavelength can be used, short wavelength lasers such as 355 and 266 nm are preferable because many materials readily absorb these wavelengths and they can be focused to small spot sizes. Short pulse width lasers such as tens of picoseconds and down into the femtosecond regime are also preferred because they provide material removal with a small heat affected zone. Typical lasers employed for these applications will have power levels on the order of watts or less.

There are numerous samples composed of disparate materials which may be desirably processed by lasers prior to imaging or alteration with an SEM/STEM/TEM and/or FIB. Some examples of these samples include semiconductor devices such as chips or wafers, packaged chips including 3D stacked packages that contain semiconductor materials, wires, and bonding agents, lithography masks, biological samples, mineral samples such as rocks, or material samples such as composites, ceramics, glasses, coatings, glues, rubbers, polymers, superconductors, magnetic materials, alloys, and metals. This is a list of a few samples representing the diversity of workpiece materials which may be processed. Many other sample materials which are not listed may also be processed.

Lasers are often selected for advantageous processing of structures of different materials. For example, a 10.6 micron wavelength $CO_2$ laser may be preferred for cutting through the packaging materials of a 3D stacked package, a pulsed 1.3 micron wavelength laser may be preferred for cutting metallic structures on the semiconductor chips within the package, and a short-wavelength pulsed laser may be preferred for processing the silicon structures on the chip. Because silicon is transparent to light of a wavelength of about 1100 nm or longer and metals absorb IR wavelengths, processing can occur with less damage to the silicon.

One challenge is that a system with a single laser cannot perform all the desired functions when different laser beams are necessary. In other words, there is no known way of performing the multiple tasks associated with different types of lasers without having to separately buy and use multiple systems configured with different laser types. In these cases, the workpiece would undergo one laser treatment from one system, transported to another laser treatment system, and then undergo another laser treatment.

Another challenge is that undesirable debris from the machining process may become deposited upon critical components in the FIB and/or SEM/STEM/TEM chamber, such as sources and detectors, and degrade their efficacy. This type of debris has the potential to hinder the functions of the FIB/SEM/STEM/TEM microscopy. Conventional electron microscopes also generally require samples to be imaged under vacuum because a gaseous atmosphere rapidly spreads and attenuates electron beams. As a consequence, the debris expelled during laser machining processes can degrade the vacuum environment and impede imaging. In other cases, the unnecessary debris after the machining process may be so large that it prevents the workpiece from actually fitting into the vacuum chamber of the SEM/STEM/TEM.

What is needed is a system wherein multiple types of laser beam spots can be used to process a workpiece in conjunction with SEM/STEM/TEM and FIB without producing large amounts of ablated material in the processing chamber.

SUMMARY OF THE INVENTION

In one preferred embodiment of the invention, a system is disclosed that uses two focused laser beam spots created from at least one laser beam source, wherein the focused laser spots act simultaneously or sequentially so that a workpiece can be properly processed for SEM/STEM/TEM and FIB imaging. The focused laser beam spots have different properties such that the workpiece can be processed differently.

The system of the preferred embodiment can have a configuration that involves two separate laser beam sources or one laser beam source, which is separated into two laser beams. This system has an external laser processing station and a laser processing station internal to the chamber, which is generally a vacuum chamber. The external laser processing station can perform bulk material removal and deep trench etching with a first laser beam spot. A second laser beam spot is used with the internal chamber station. The second laser beam spot is used for precision work, such as micro-machining, drilling, routing, etching, and heat affected zone removal processes.

An object of this invention is to improve the use of different types of laser beam spots so that the system can perform large bulk material removal or deep trench etching separately from the finer, higher precision milling or machining that is often needed in SEM/STEM/TEM/FIB imagining processes.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Various embodiments of the present invention employ different configurations for laser processing that is used with a SEM/STEM/TEM and/or FIB. These configurations employ one or more laser sources to produce laser spots of different processing properties for internal vacuum chamber use and external station use. Whether these configurations utilize one laser source or multiple laser sources, different types of focused laser spots are created and used to process the workpiece separately and/or differently.

Described herein are many optic component choices from which these systems can be constructed. The embodiments described herein include possible arrangement of optical system components, using laser sources, mirrors, beam splitters, beam steering mechanisms, and beam altering optics. Other arrangements with the scope of the attached claims can readily be designed using ordinary skill in the art.

Figure 1A:
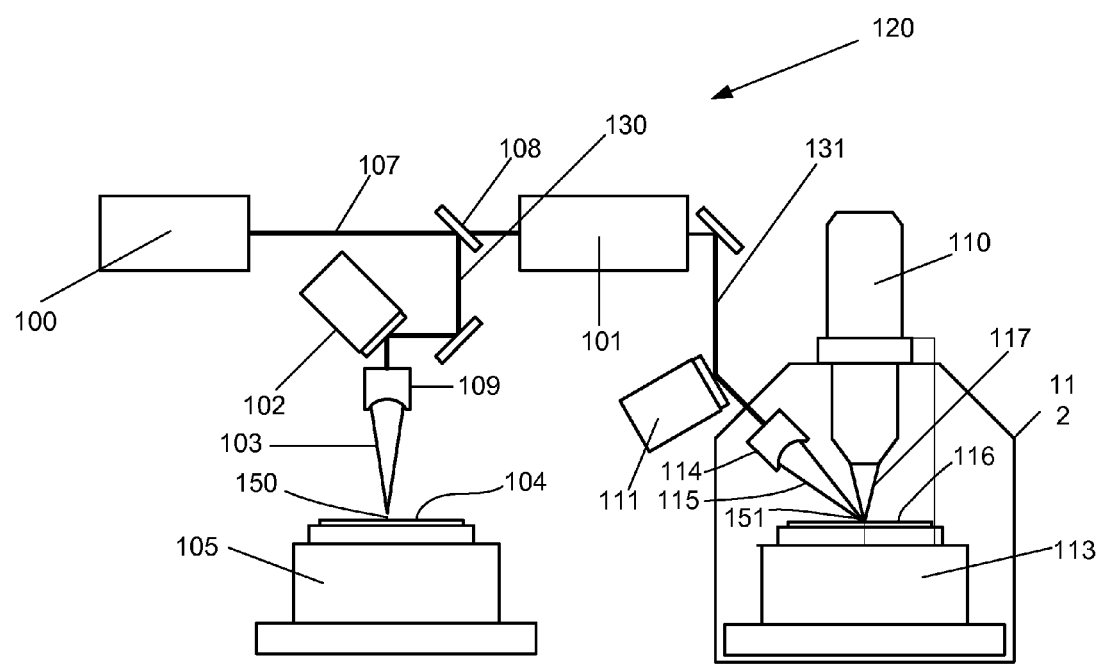
FIG. 1A shows an embodiment having one laser source that is split into two laser beams and used with external processing station and an internal chamber station having a focused ion beam.

FIG. 1A shows a preferred embodiment of a multi-laser beam system 120 which uses one laser source and two separate processing stations. A laser source 100 generates a laser beam of sufficient energy to be used for the entire multi-laser beam system 120. Laser source 100 can be an ultra-fast pulsed laser such as a femtosecond laser described in U.S. Pat. No. 5,656,186, to Mourou et al. Such lasers can remove material much more quickly from a workpiece than can a typical focused ion beam, although the laser is not as precise as the ion beam. The workpiece is intended for further processing, so it is possible for the system 120 to employ a lower cost laser source, such as continuous wave laser, nanosecond laser, or a $CO_2$ laser, which is effective for high volume material processing. Many of these low cost laser sources provide sufficient power such that the laser beam can be split and delivered to multiple focused spots on multiple workpieces. A more extensive list of laser sources suitable for bulk material processing is described below.

Laser source 100 produces an original laser beam 107 that is split at beam splitter 108. Beam splitter 108 is capable of splitting the beam into two independent laser beams with varying energy. Various beam splitters can be employed. Beam splitters may be bulk optics such as polarizing beam splitter cubes or partially reflecting mirrors. Optical components for switching or steering beams may also serve as beam splitters by allowing pulses to propagate along different paths to work surfaces. Pulses may be delivered in bursts or delivered alternating down the different beam paths. Optical components that can be configured and driven to perform beam splitting include AOMs, EOMs, pockel cells, and switchable LCD polarizers. Alternatively, fiber optic couplers may serve as the beam splitter in fiber-optic implementations.

The beam splitter 108 directs a beam down first laser beam pathway 130, which is acted upon by first scan mirror 102, a beam steering mechanism, and a first objective lens 109. The beam splitter 108 allows for two separate laser beams such that if there is a need for separate laser beam processing of a workpiece, two separate laser sources are not necessary. The system allows for the processing of two separate workpieces at the same time, workpiece 104 that is processed on the external station 105 and the second stage workpiece 116, which is processed in the internal chamber 112, which is generally a vacuum chamber. The first scan mirror 102 and first objective 109 are capable of producing a first laser beam 103.

The first laser beam 103 produces a first laser spot 150 at external station 105 that is used for bulk material removal and cutting deep trenches to expose an area of interest on the workpiece 104. Workpiece 104 may contain packaging materials that are unnecessary for the imaging process. The first laser beam 103 is capable of slicing off the unnecessary packaging materials on the external station 105. For example, 3D IC packages for integrated circuits often contain sections that are several mm thick. The laser spot 150 from the first laser beam 103 can be used to cut the package in half or cut a trench along its length at the external station 105 before the workpiece 104 can be further processed in the internal chamber 112. If these bulk operations, which may involve removing up to tens or hundreds of cubic millimeters of material, were performed in the internal chamber 112, they could impede the SEM/STEM/TEM/FIB process by corrupting the vacuum environment or depositing debris upon sensitive components.

Many applications are well suited to bulk laser processing external to the chamber 112 followed by fine internal laser processing. In the field of mineral processing and energy exploration, various mineral samples can be processed using a first laser beam 103 to expose the interior sections prior to finer, more precise processing inside the internal chamber 112. The external laser station 105 can also remove a portion of workpiece 104 which would otherwise not fit into internal chamber 112. For example, the external laser station 105 can be used to cut a portion of a large semiconductor wafer.

Beam steering mechanisms are typically in the class of rotation generators. Mechanical rotators include steering mirrors that may be actuated with piezoelectric, electromagnetic, electrostrictive, or other actuators. Galvanometers, tilt wedges, and arrays of micromachined mirrors also fall into the category of mechanical beam deflectors. Other optical elements that can steer optical beams include AOMs and EOMs.

Once in the internal chamber 112, the transferred workpiece which becomes second stage workpiece 116, will undergo additional, higher precision processing. The transfer of the workpiece 104 from the external station 105 to internal chamber 112 can be performed manually or automatically. Workpieces at both the external station 105 and internal station 113 can be processed at the same time or sequentially.

A turbo-molecular pump (not shown) is typically employed for evacuating and maintaining high vacuum in the internal chamber 112. The vacuum system provides within internal chamber 112 a vacuum of typically between approximately $1\times10^{-7}$ Torr and $5\times10^{-4}$ Torr. Electron and ion sources are typically evacuated turbo pumps and then maintained with ion pumps at lower pressures such as $1\times10^{-10}$ Torr to $1\times10^{-7}$ Torr.

A high voltage power supply (not shown) is connected to FIB 110 and is capable of forming an approximately 1 keV to 60 keV ion beam. The system can alternatively include an SEM/STEM/TEM. The FIB and/or SEM/STEM/TEM would include respective deflectors and lenses, which are typically magnetic though electrostatic is also possible. Magnetic lenses and deflectors have a controller and amplifiers which drive magnetic coils to produce magnetic deflection fields. Electrostatic lenses and deflectors have a controller and amplifiers which drive charged plates for to produce electric deflection fields.

Once laser beam 107 is split by the beam splitter 108, a portion of the beam travels along the second laser beam pathway 131 which may include beam conditioning station 101. The conditioning of the laser beam is in an effort to prepare the laser beam for the finer, precision work that is needed in the internal chamber 112. Conditioning station 101 is capable of altering laser beam properties such as power. The conditioning station 101 may also alter the amplitude, energy, polarization, temporal pulse shape, spatial profile, wavelength, or other properties of the laser beam. Conditioning station 101 is optional and may be unnecessary in some applications.

A wide assortment of beam conditioning optics may be included in the beam conditioning station 101. Similar and/or different elements may be used in the conditioning of different beam paths. These optical elements may include polarizers, polarization modifiers, faraday isolators, spatial beam profile modifiers, temporal beam profile modifiers, frequency shifters, frequency-multiplying optics, attenuators, beam splitters, amplifiers, mode-selecting optics, beam expanders, lenses, and relay lenses. Beam splitter 108, which may split laser beam 107 into beams with equal or different power ratios, may also be considered a conditioning optic. Optical elements may also include delay lines that can consist of extra optical path distance, folded optical paths, and fiber-optic delay lines.

U.S. Pat. No. 7,923,306, by Bruland et al., issued Apr. 12, 2011, discusses in length descriptions of lasers, arrangements, configurations, and beam modifying elements, as well as discussions regarding the use of one or two lasers to deliver multiple spots to one single workpiece, and is herein incorporated by reference.

The second laser beam 115 can independently travel along second beam path 131 and be acted upon by second scan mirror 111, second objective lens 114 and result in its own focused laser spot 151. The second laser beam 115 with its associated beam spot 151 works with FIB 110 in processing the second stage workpiece 116 in internal chamber 112

Following the bulk material removal in external station 105, the second laser beam 115 and its associated beam spot 151 can be used for finer machining operations. Lasers that are capable of finer, more precise machining may include solid state lasers, such as diode-pumped q-switched solid state lasers, including lasers containing rare-earth-doped lasants such as Nd:YVO$_{.4}$, Nd:YLF, and Nd:YAG and vibronic lasants such as alexandrite, Cr:LiSAF, and Cr:Li-CAF. A more extensive list of laser sources that are capable of finer machining is discussed below. The second laser beam 115 and its associated laser spot 151 can also be used to remove a heat affected zones prior or be used to slice miniature section of the workpiece 116 prior to SEM/STEM/TEM and FIB operations. This process is sometimes referred to as 'slice and view', and can be repeated multiple times to measure a 3D measurement of a sample interior or locate and image an interior feature.

The second laser beam 115 and its associated laser spot 151 works together with the focused ion beam column 110, which is capable of generating a sub-one tenth micron beam for performing precise processing of workpiece 116 positioned on station 113. The material removal rate of the ion beam 117 from focused ion beam column 110 is relatively low. Skilled persons will understand that the removal rate and the beam spot size vary with the beam current. The removal rate also varies with the material being removed and the species of etch-enhancing gas, if any, that is used with the beam.

Removal of bulk material from workpiece 104 at external station 105 reduces amount of material generated during subsequent processing of workpiece 116 at internal station 113, hence reducing contamination of the vacuum and components in internal chamber 112. Overall, debris that is generated at the external station 105 will be discarded before being transferred into the internal chamber 112 so that the debris will not have the potential to interfere with the vacuum and components involved in the SEM/STEM/TEM and FIB processes. Due the segregation of each of the station, there will be increased system longevity of the SEM/STEM/TEM and FIB components by keeping bulk debris away from optics.

Figure 1B:
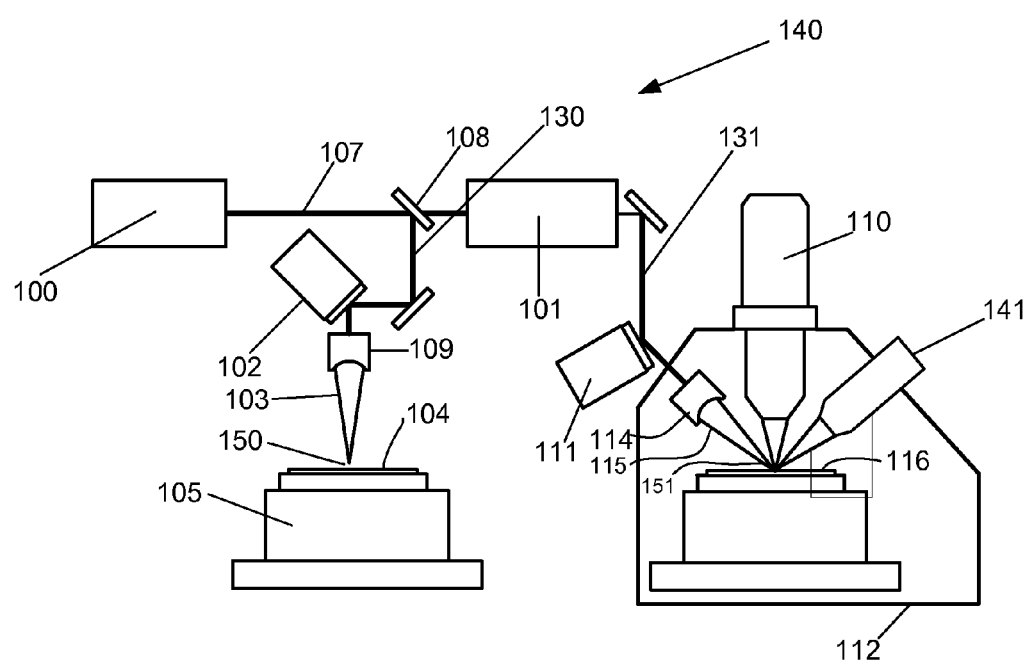
FIG. 1B shows another embodiment having one laser source that is split into two laser beams and used with external processing station and an internal chamber station having a focused ion beam and an SEM/STEM/TEM.

FIG. 1B shows another embodiment of the present invention of system 140. System 140 includes all the features and components of system 120 in FIG. 1B and further includes an electron microscope 141. The embodiment of the present invention is not limited to one FIB source. The laser system 140 can have one FIB, multiple FIBs, or one or more FIBs with one or more electron microscopes.

While the liquid metal ion source (LMIS) is the most common FIB source which delivers gallium ions, other less traditional FIB sources such as neon or helium sources may be used. The electron microscopes used in these systems will commonly be a SEM, however other types of electron microscopes such as TEM, and STEM. The principles and advantages of the system described within this document are applicable to any of the numerous types of electron microscopes and/or FIBs.

Figure 1C:
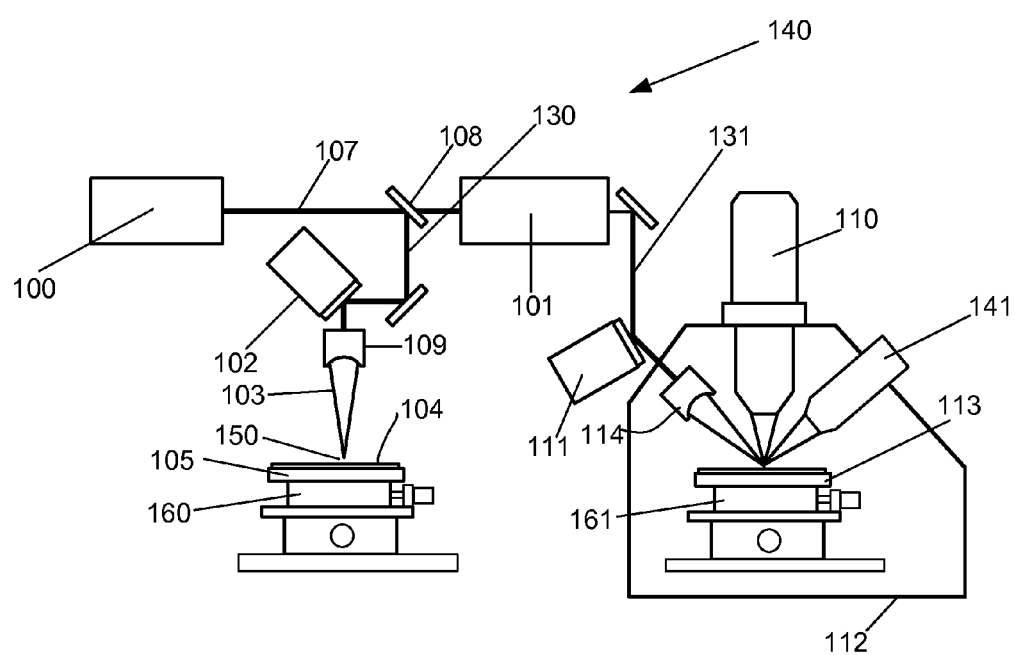
FIG. 1C shows another embodiment having one laser source that is split into two laser beams and used with an external processing station with a motion stage and an internal chamber station with a motion stage.

FIG. 1C shows another embodiment of the present invention of system 140. System 140 includes all the features and components of system 120 in FIG. 1B and further include mechanical positioning stages that can reposition workpieces. External station 105 and internal station 113 may consist of platforms upon which the workpieces rest. They may further contain clamps or holders designed to properly secure samples for processing. These stations may additionally contain motion systems for adjustment of workpiece position prior to processing or during processing. Motion stage 160 is part of external station 105 and motion stage 161 is part of internal station 113. In this context, position may mean linear or angular position including, but not limited to, lateral positioning, vertical positioning, tilting or rotating. Such positioning may work in conjunction with beam steering mechanisms, such as scan mirror 102, to direct the laser to process the proper location on the workpiece. In fact, targeting or repositioning of laser spot locations on the workpiece may be performed entirely with mechanical repositioning of the workpiece, entirely with beam steering mechanisms, or with a coordinated effort of mechanical workpiece positioning and beam steering working on concert.

The principles and advantages of the system described within this document are applicable to any member of the broad class of charged particle beam instruments which encompasses both electron microscopes and FIBs. While the liquid metal ion source (LMIS) is the most common FIB source which delivers gallium ions, other less traditional FIB sources such as plasma focused ion beam (PFIB) or alternative ions such as neon or helium may be used. The electron microscopes used in these systems will commonly be scanning electron microscopes (SEM), however other types of electron microscopes such as TEM (transmission electron microscope) and STEM (scanning transmission electron microscope) may also be implemented.

Figure 2:
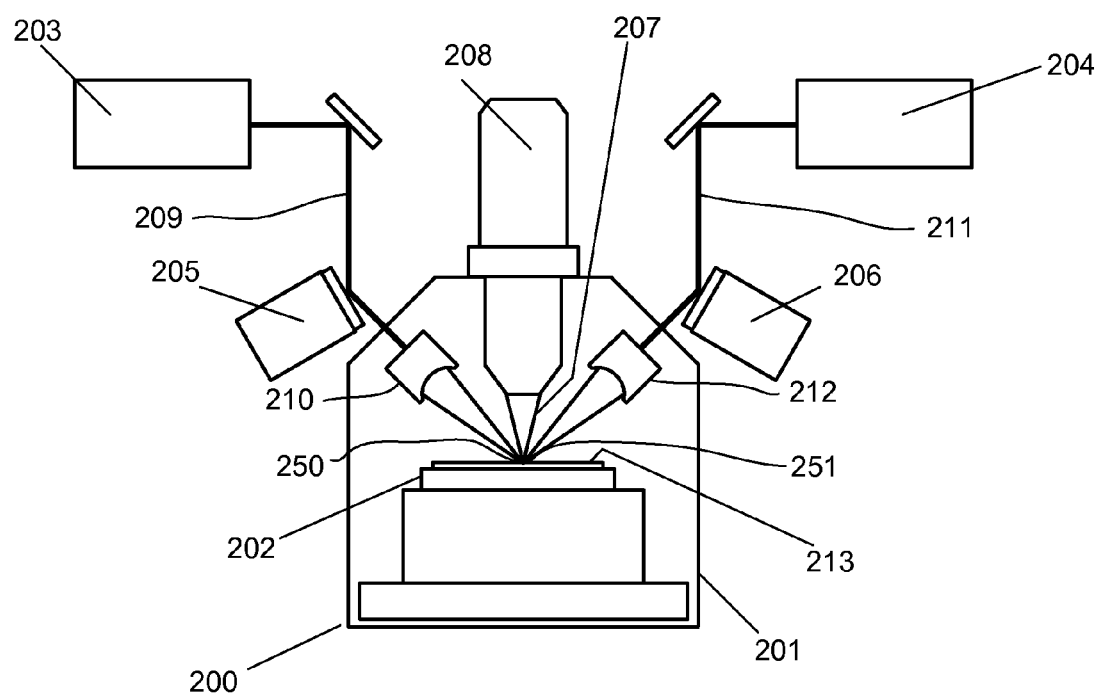
FIG. 2 shows an embodiment of the invention having two laser sources that independently produce two laser beams for the processing of a workpiece together with a SEM/STEM/TEM and/or FIB.

FIG. 2 shows another preferred embodiment showing a configuration having a dual laser system 200 that uses two independent laser sources to generate two independent laser beams and respective laser beam spots. This system includes a focused ion beam column 208 and can alternatively include an SEM (not shown). Different types of lasers offer different machining benefits, and this configuration offers the use of two separate lasers, a first laser source 203 and a second laser source 204. Each of the first laser source 203 and second laser source 204, and their respective focused spots 250 and 251, may have independent characteristics that affect the ability to remove sample materials. The ability of a laser spot to ablate, machine, remove or alter a sample material is defined as its strength, which may distinguished by any optical characteristic such as power, amplitude, energy, pulse width, temporal pulse shape, spot size, spatial pulse distribution, fluence, polarization, and wavelength.

The use of different lasers and different laser pulse properties in multi-beam laser processing may favorably improve the processing of sample materials. Many different types of laser sources may be employed or combined in multi-beam laser processing systems. Depending upon the sample materials involved and the desired processing results, some laser sources may be better suited for bulk material removal and others may be better suited for fine sample processing.

The laser sources may include solid state lasers, such as diode-pumped q-switched solid state lasers, including lasers containing rare-earth-doped lasants such as $Nd:YVO_4$, Nd:YLF, and Nd:YAG and vibronic lasants such as alexandrite, Cr:LiSAF, and Cr:LiCAF.

The laser sources may further include diode-pumped mode-locked solid state lasers, such as, SESAM mode-locked $Nd:YVO_4$ lasers capable of producing pulsed picosecond laser output. Mode-locked solid state lasers may include oscillator-regenerative amplifier and oscillator-power amplifier configurations. The laser sources may also include chirped pulse amplification laser systems for the generation of femtosecond (fs) laser output or may alternatively include other pulse stretching and compression optics well-known to the art for the purpose of generating pulsed femtosecond laser output.

The laser sources may further include pulsed rare earth-doped solid core fiber lasers and pulsed rare-earth-doped photonic crystal fiber lasers. Pulsed rare-earth-doped fiber lasers may include q-switched and oscillator-amplifier configurations. Further, a wide variety of oscillators may be employed, including broad area semiconductor lasers, single-frequency semiconductor lasers, light emitting diodes, q-switched solid state lasers, and fiber lasers.

Additional laser sources may further include semiconductor lasers, gas lasers, including $CO_2$ and argon-ion lasers, and excimer lasers.

A wide range of wavelengths, from about 150 nm to about 11,000 nm, can be produced by the laser sources that can be included in multi-beam laser processing systems. Depending on the laser sources employed, pulsewidths ranging from 10 fs to greater than 1 µs and PRFs ranging from continuous wave to greater than 100 MHz can be produced at the time of this writing. Depending on the laser sources employed, the pulse shape, energy per pulse or output power, pulsewidth, polarization, and/or wavelength may be tunable or selectable.

The fundamental wavelength output of the lasers described above may also be converted to harmonic wavelengths through the well-known process of nonlinear harmonic conversion. This may be done inside the laser source itself, such as first and second laser sources 203 and 204, or inside of conditioning station such as 101.

The dual laser system includes a vacuum chamber 201 that contains within it the internal processing station 202 for workpiece 213. First laser source 203 produces a laser beam 209 that goes to scan mirror 205 and through objective lens 210 where it is focused to produce a first laser beam spot 250. The second laser source 204 produces a laser beam 211 that goes to scan mirror 206 and through objective lens 212 and is focused to produce a second laser beam spot 251. The FIB column 208 also produces a beam of charged particles 207 that is directed onto the workpiece 213. Both the first laser beam 209 and the second laser beam 211 approach the workpiece at an angle compared to the ion beam 207 and can work on workpiece 213 simultaneously or sequentially. All of the optical and particle beams may operate on the workpiece simultaneously or sequentially. All of the beams may also be directed to fully overlap, partially overlap, or be non-overlapping on the workpiece.

The system depicted in FIG. 2 is merely a graphic of one possible configuration, however many different configurations are possible. The two laser beams may be delivered inside the chamber, outside the chamber, or a combination of inside and outside the chamber. The two laser sources and any portion of the optical components may reside inside the chamber, outside the chamber, or a combination of inside and outside the chamber. The second laser 211 may also be an amplified version of the first laser 209. Nor is the present invention limited to two laser beams. It may be advantageous to employ three or more laser beams to achieve greater throughput, to have the ability to process multiple sites at once, or to have the option of selecting among multiple different laser properties each with desirable processing capabilities on different materials.

The first laser beam 209 and a second laser beam 211 are focused in different laser spots 250, 251. Each laser spot can be of different size or different shape depending on the characteristics of each laser beam source, beam path optics, and focusing optics. Because each of the first laser beam 209 and laser beam 211 has its own beam deflector, each beam has the ability to synchronize deflection profiles of its corresponding laser spot and the ability to create separate pulse generation timing of its corresponding spot. Scan mirrors 205 and 206 are examples of beam deflectors. The beam deflectors acting upon the first and second laser beam may have their deflection commands synchronized to produce a desired spatial relationship between the two laser beams during processing. A desired spatial relationship may be either overlapping, partially overlapping, or non-overlapping to work on the same area or different areas of the workpiece. The timing of pulse generation between the first and second laser beams may also be synchronized to produce pulses at the same time, different times, or with a desired overlap in time. The spatial relationship and/or timing of any number of laser beams, electron beams, and FIBs may be coordinated. These processes may additionally be synchronized with any motion subsystems in that are part of external and internal processing stations.

A control system, not shown, is used to synchronize the spatial and temporal arrangement of laser spots and particle beams. Such control system will typically involve one or more computer systems and electronics that interface with the laser sources, SEM/STEM/TEM, FIBs, optical, electron, and particle beam deflectors, motion stages, and other actuated components in the system, for example some types of beam conditioning optics. Feedback control systems are commonly employed to perform precision adjustments through the use of sensor feedback and control algorithms. Software and firmware that coordinates and controls system components is stored in an electronically readable format such as on a hard disk or in flash memory.

Figure 3:
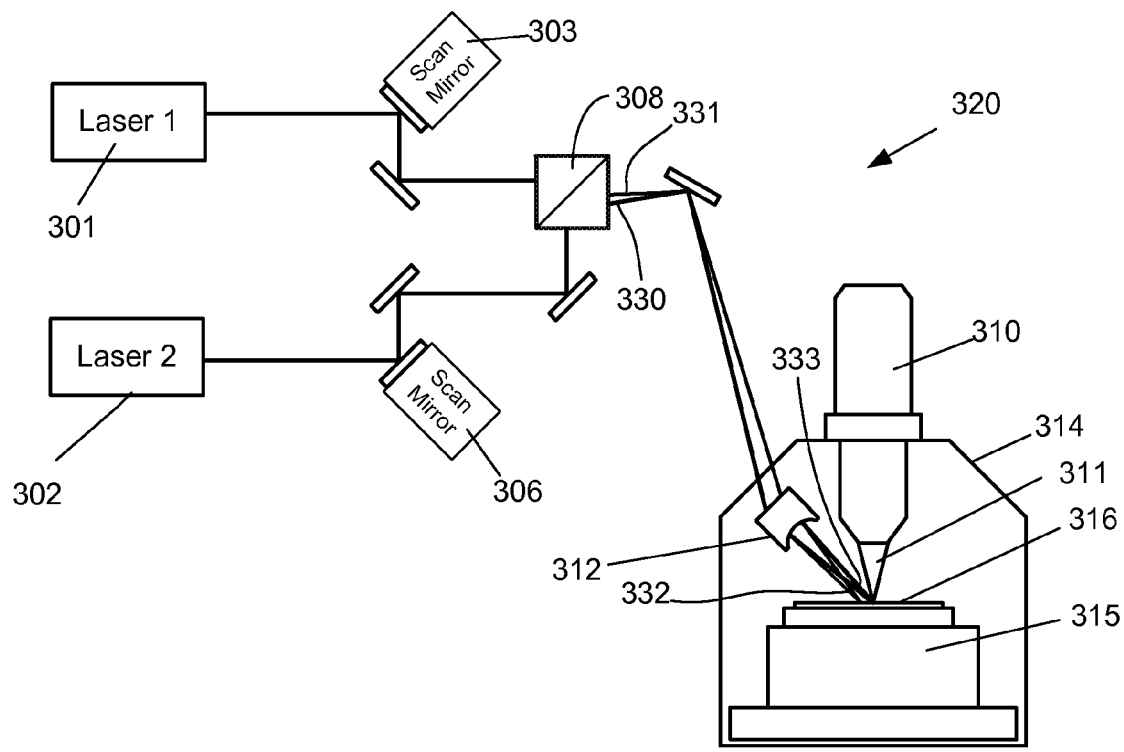
FIG. 3 shows an embodiment of the present invention having separate laser beams creating two independent laser spots.

FIG. 3 shows an embodiment of the present invention having separate laser beams creating two independent laser spots. Dual laser system 320 uses two independent laser sources 301, 302 to generate two independent laser beams. This system includes a focused ion beam column 310 and can include an SEM/STEM/TEM (not shown). Each of the laser beams from lasers 301 and 302 may produce focused spots 332 and 333 with independent characteristic such as wavelength, temporal pulse profile, energy, power, spot size, spot shape, and polarization.

The dual laser system 320 includes a vacuum chamber 314 that carries within it the internal processing station 315 for workpiece 316. First laser source 301 produces a laser beam that goes to scan mirror 303 and through beam combiner 308, producing a beam 331. A common beam combiner is a polarizing beam cube which may efficiently combine lasers beams of different polarization. Beam 331 goes through objective lens 312 where it is focused to produce a first beam spot 332. The second laser source 302 produces a laser beam that goes to scan mirror 306 and through beam conditioner 308 to produce a second beam 330. Second beam 330 goes through objective lens 312 and is focused to a second beam spot 333. Relay optics, which are not shown, may be employed in these types of systems to aid in beam delivery. The FIB 310 also produces a beam of charged particles 311 that is directed onto the workpiece 316.

Figure 4:
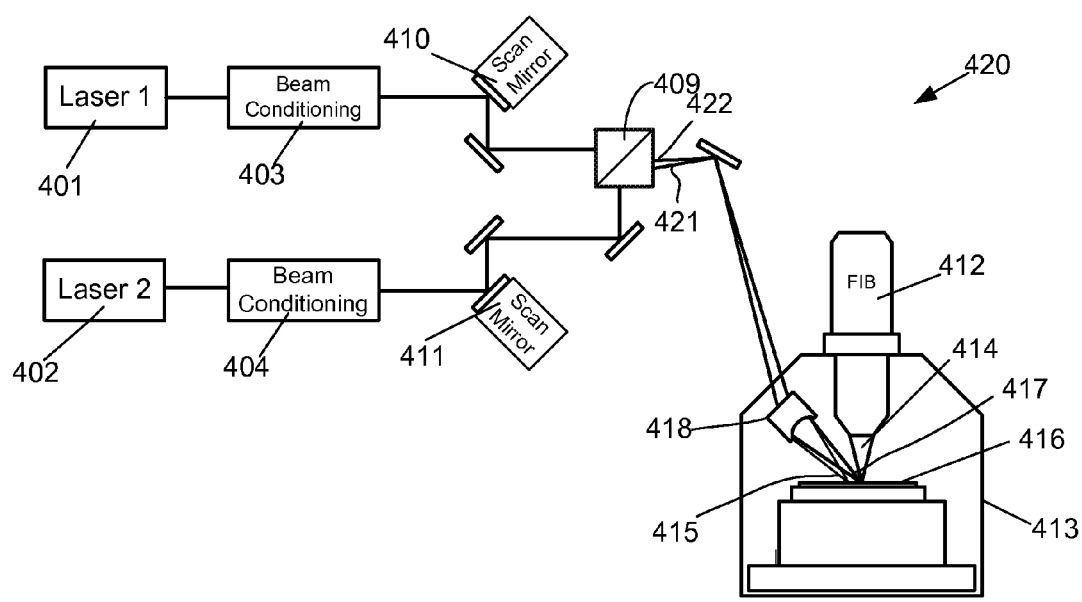
FIG. 4 shows an embodiment of the present invention having separate laser beams creating two independent laser spots with beam conditioners.

FIG. 4 shows an embodiment of the present invention having separate laser beams having beam conditioners that create two independent laser spots. Dual laser system 420 uses two independent laser sources 401, 402 to generate two independent laser beams. The laser beams go through respective beam conditioning stations 403 and 404. The different types of beam conditioning optics are discussed extensively above. This system includes a focused ion beam column 412 having a charged beam 414 and can include an SEM/STEM/TEM (not shown). Each of the laser sources from lasers 401 and 402 may further be modified through beam conditioning stations 403 and 404, and produce focused spots 415 and 417 with independent characteristics such as wavelength, temporal pulse profile, energy, power, spot size, spot shape, and polarization.

The dual laser system 420 includes a vacuum chamber 413 that contains within it the internal processing station for workpiece 416. First laser source 401 produces a laser beam that goes through beam conditioner 403, a deflecting scan mirror 410, and beam splitter 409, producing a beam 422. Beam 422 goes through objective lens 418 where it is focused to produce a first beam spot 415. The second laser source 402 produces a laser beam that goes through beam conditioner 404, a deflecting scan mirror 411, and a beam splitter 409 to produce a second beam 421. Second beam 421 goes through objective lens 418 and is focused to a second beam spot 417.

Figure 5:
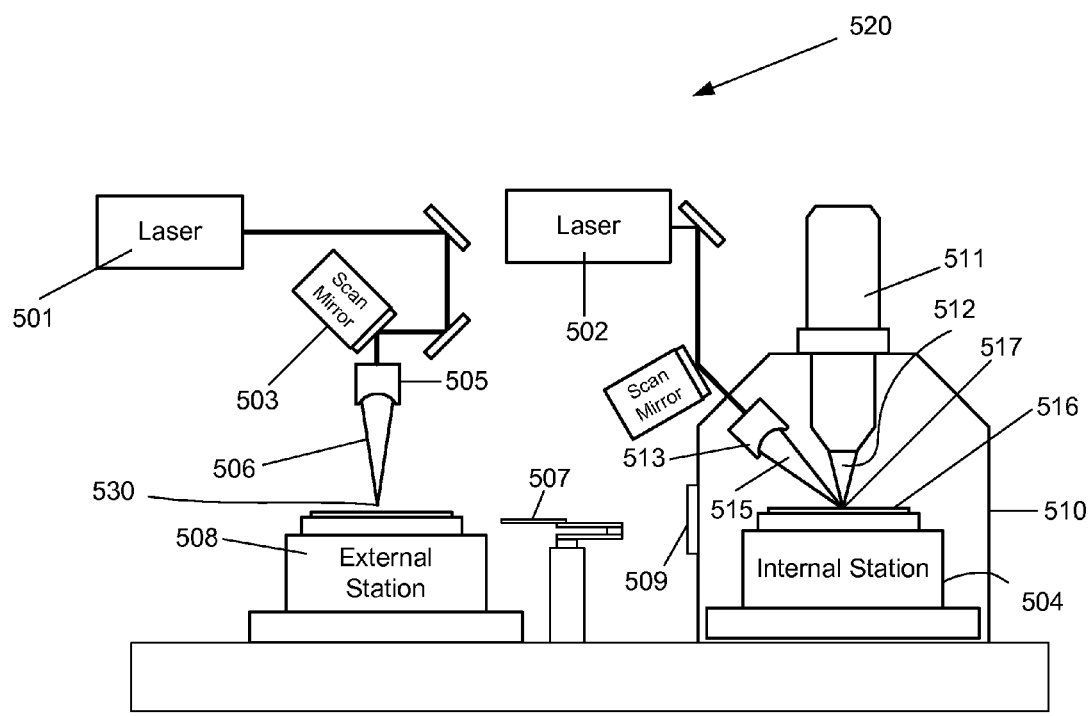
FIG. 5 shows an embodiment of the present invention having one laser spot delivered outside the vacuum chamber and one laser spot delivered inside the vacuum chamber.

FIG. 5 shows an embodiment of the present invention having one laser beam delivered outside the vacuum chamber and one laser beam inside the vacuum chamber. Multi-laser beam system 520 generates two laser beams with laser beam source 501 and laser beam source 502. The laser beam from laser beam source 501 goes to deflecting scan mirror 503 and thorough objective lens 505, producing a laser beam 506 having a first laser spot 530. First laser spot 530 processes a workpiece on external station 508. First laser spot 530 may be used for bulk material removal and cutting deep trenches to expose an area of interest on the workpiece.

The system 520 includes a robot 507 on a movable stage that transfers material from the external station 508 to internal station 504. The robot 507 transfers the workpiece through the chamber door 509. The robot 507 can transfer the workpiece automatically or manually. A vacuum interlock, not shown, may be associated with the chamber door to allow loading of samples without venting the chamber 510. Once in the internal chamber 510, the transferred workpiece, now called the second stage workpiece 516, will undergo additional, higher precision processing. Internal chamber 510 is generally a vacuum chamber. Processes at both the external station 508 and internal station 504 can be performed simultaneously or sequentially.

A second laser source 502 generates a laser beam that is processed through a deflecting scan mirror, and is focused through an objective lens 513 producing a laser beam 515 with its own focused spot 517. The second laser beam spot 517 works with FIB column 511 that produces a charged particle beam 512 in processing the workpiece. The debris that is accumulated from the external station 508 will be discarded before being transferred into the internal chamber 510 so that the debris will not have the potential to interfere with the vacuum chamber 510 and the FIB processes. Due to the segregation of each of the station, there will be increased system longevity of the SEM/STEM/TEM and FIB components by keeping bulk debris away from optics.

Figure 6:
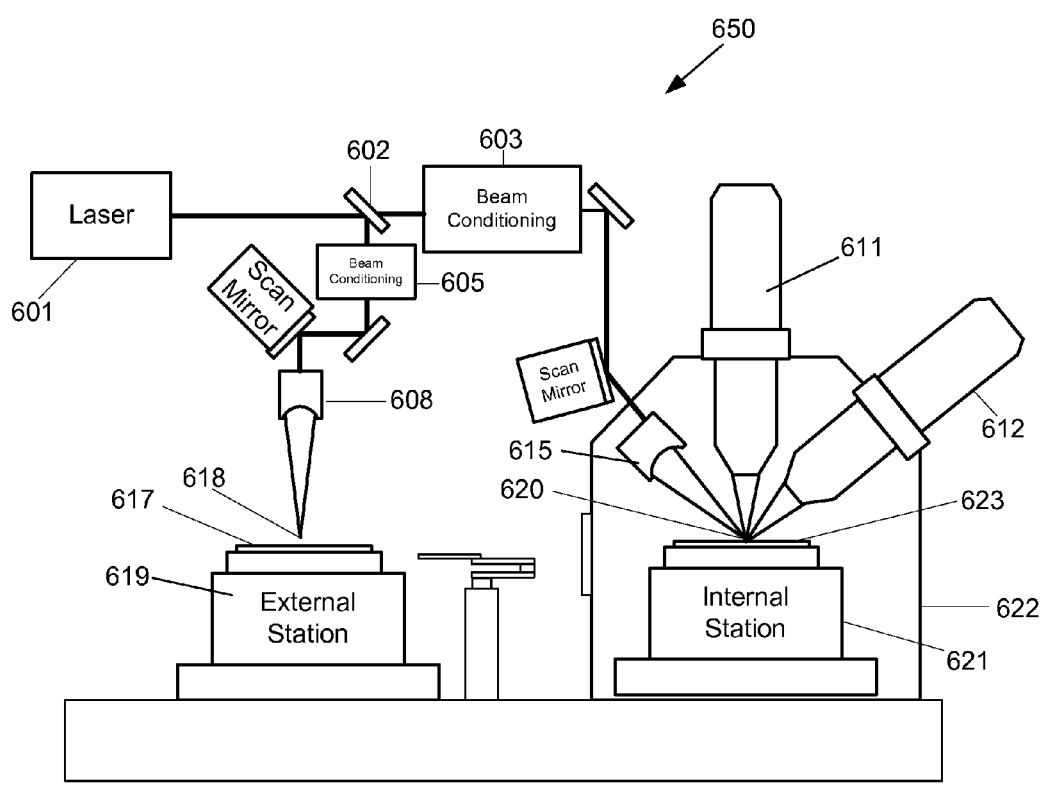
FIG. 6 shows an embodiment of the present invention having one laser spot delivered outside the vacuum chamber and one laser spot delivered inside the vacuum chamber wherein there is disclosed both a SEM/STEM/TEM and a FIB.

FIG. 6 shows system 650, another embodiment of the present invention having one laser source 601, a beam splitter 602, separate beam conditioning stations 603 and 605 and both a FIB 612 and a SEM/STEM/TEM 611 with beams delivered inside the vacuum chamber 622. Similar to the embodiment shown in FIG. 1A, the laser beam is generated from one source and split. The first laser beam goes to a deflecting scan mirror, through an objective lens 608, and produces a first beam spot 618 on workpiece 617 on external station 619. The second laser beam goes to a deflecting scan mirror and through objective lens 615, which results in second laser beam spot 620 to process workpiece 623 within the vacuum chamber 622 on internal station 621. The use of the FIB 612 and the SEM/STEM/TEM 611 in conjunction with the second laser beam spot allows for the finer precision work.

No prior art is known to use more than one type of laser beam for separate, independent functions in conjunction with a particle beam instrument. No prior art is known that employs a laser processing capability in the vacuum chamber that also employs multiple laser beams for process enhancement and debris management.

There are several benefits of having a laser beam system with multiple laser beam spots. A system that has multiple beam spots will increase processing capabilities by performing bulk operations with a laser beam suitable for bulk operations and then be able to perform precision operations, such as HAZ removal and micro-scale slicing with a laser beam suitable for precision work. Having independent laser spots allows for the employment of particular lasers suited to different materials and properties. Another benefit of this system is to allow one system to do separate functions, such as bulk material removal and finer precision work, without the need to purchase two separate systems. By having only one work station, all beam modifications, including the FIB processes, SEM/STEM/TEM process, and processes with the first laser beam spot and the processes of the second laser beam spot can be performed without the need to move the workpiece 213 from one system to another. Such transference may require careful data and material tracking operations. There are specific benefits of having independent lasers to make separate beam spots. One laser beam can be used for bulk removal and fine work by a separate laser may be employed for processing different types of materials. For example, in the case of a stacked 3D IC package, one laser may be selected that is adept at cutting through bulk packaging materials or bonding agents and a second laser may be selected that is adept at fine processing of silicon chips.

It should be appreciated by those skilled in the art that the conception and specific embodiments disclosed herein may

We claim as follows:

1. A method of using a charged particle beam system, comprising:
   providing an internal processing station in which the internal processing station includes a vacuum chamber;
   providing an external processing station disposed outside of the internal processing station in which the external processing station does not include a processing chamber;
   carrying out bulk material removal, trench formation, or a combination thereof with the external processing station on a first workpiece in an unenclosed environment by directing a first laser beam spot onto said first workpiece, the first workpiece being unenclosed within a processing chamber;
   processing a second workpiece with the internal processing station by directing a second laser beam spot onto said second workpiece, the second workpiece being enclosed inside the vacuum chamber of the internal processing station, and
   processing said second workpiece with the internal processing station by directing at least one particle beam onto said second workpiece, the second workpiece being enclosed inside the vacuum chamber of the internal processing station.

2. The method of claim 1 wherein said at least one particle beam includes a focused ion beam.

3. The method of claim 1 wherein said at least one particle beam includes an electron beam.

4. The method of claim 1 wherein said at least one particle beam includes both a focused ion beam and an electron beam.

5. The method of claim 1 wherein after directing the first laser beam spot onto said first workpiece, said first workpiece is transferred inside the vacuum chamber of the internal processing station and then processed as said second workpiece.

6. The method of claim 5 wherein the processing of said first workpiece and the processing of said second workpiece is performed simultaneously.

7. The method of claim 5 wherein the processing of said first workpiece and the processing of said second workpiece is performed sequentially.

8. The method of claim 1 wherein said processing of said second workpiece is a more precise form of processing than the processing of the first workpiece by the first laser beam spot.

9. The method of claim 1 wherein said first laser beam spot and said second laser beam spot are generated by the same laser beam source.

10. The method of claim 9 wherein the second laser beam spot has modified optical properties different than the first laser beam spot.

11. The method of claim 1 wherein said first laser beam spot and said second laser beam spot are generated by different laser beam sources.

12. The method of claim 1 wherein said first laser beam spot and said second laser beam spot have different strength so that they have the capability to perform different functions.

13. A particle beam system comprising:
   an internal processing station including a vacuum chamber for processing a workpiece;
   an external processing station disposed outside said internal processing station in which the external processing station does not include a processing chamber;
   a first laser for delivering a first laser beam spot to the external processing station for processing a first workpiece in an unenclosed environment;
   a second laser for delivering a second laser beam spot to the vacuum chamber of the internal processing station for processing a second workpiece in a vacuum; and
   a particle beam source for processing said second workpiece inside said vacuum chamber of the internal processing station.

14. The particle beam system of claim 13 in which the second laser beam spot is conditioned by one of the following processes: wavelength conversion, time slicing, amplification, and attenuation.

15. The particle beam system of claim 13 in which particle beam source is an SEM.

16. The particle beam system of claim 13 in which particle beam source is an STEM.

17. The particle beam system of claim 13 in which particle beam source is a FIB.

18. The particle beam system of claim 13 further including one or more additional particle beam sources and the particle beam sources are of the following types: FIB, SEM, TEM, and STEM.

19. The particle beam system of claim 13 which further includes a first scanning mirror which acts upon the first beam delivered to first spot and further includes a second scanning mirror which acts upon the second beam delivered to the second spot.

20. The particle beam system of claim 13 which further includes a conditioning device for the processing of the second laser beam wherein the first laser beam and the second laser beam have different strengths.

21. The particle beam system of claim 13 wherein:
   said first laser is capable of bulk material removal, trench etching, or a combination thereof; and
   said second laser is a solid state laser.

22. A method of processing a workpiece comprising:
   providing an internal processing station in which the internal processing station includes a vacuum chamber;
   providing an external processing station disposed outside of the internal processing station in which the external processing station does not include a processing chamber;
   processing a workpiece in an unenclosed environment by directing a first laser beam spot onto the workpiece at the external processing station;
   discarding debris generated by directing the first laser beam spot onto the workpiece;
   transferring said workpiece to the vacuum chamber of the internal processing station after discarding the debris;
   processing the workpiece by directing a second laser beam spot onto said workpiece in the vacuum chamber of the internal processing station; and
   processing the workpiece by directing a charged particle beam onto said workpiece in the vacuum chamber of the internal processing station.

23. The method of claim 8 wherein said processing of said second workpiece comprises machining, etching, or milling.

24. The particle beam system of claim 13, wherein the first station comprises a first motion stage and the second station comprises a second motion stage.

25. The particle beam system of claim 13, wherein the first station comprises a first stage and the second station comprises a second stage, and further comprising a movable stage coupled to a robotic arm configured to transfer the workpiece from the first stage to the second stage.

26. The particle beam system of claim 21, wherein the solid state laser is a diode-pumped q-switched solid state laser.

* * * * *